United States Patent [19]

Okada

[11] Patent Number: 5,429,986
[45] Date of Patent: Jul. 4, 1995

[54] ELECTRODE FORMING PROCESS

[75] Inventor: Hiroyuki Okada, Yokohama, Japan

[73] Assignee: Sumitomo Electric Industries, Ltd., Japan

[21] Appl. No.: 276,754

[22] Filed: Jul. 14, 1994

Related U.S. Application Data

[63] Continuation of Ser. No. 26,075, Mar. 4, 1993, abandoned, which is a continuation of Ser. No. 674,201, Mar. 25, 1991, abandoned.

[30] Foreign Application Priority Data

Apr. 2, 1990 [JP] Japan ................................ 2-88040

[51] Int. Cl.⁶ .......................................... H01L 29/40
[52] U.S. Cl. ................................... 437/184; 437/189; 437/201; 437/202
[58] Field of Search ................ 437/184, 189, 201, 202

[56] References Cited

U.S. PATENT DOCUMENTS

| | | | |
|---|---|---|---|
| 4,214,966 | 7/1980 | Mahoney | 156/643 |
| 4,648,095 | 3/1987 | Iwasaki et al. | 372/44 |
| 4,811,079 | 3/1989 | Mallard | 437/177 |
| 5,024,958 | 6/1991 | Awano | 437/133 |
| 5,036,023 | 7/1991 | Dautremont-Smith et al. | 437/184 |

FOREIGN PATENT DOCUMENTS 1-241132 9/1989 Japan ................................... 437/184

OTHER PUBLICATIONS

K. Tsutsui et al., "Ion Beam Mixing of Pt/GaAs and Formation of Ohmic Contacts," *Journal of Applied Physics*, vol. 56, No. 2, Jul. 15, 1984, p. 560.

G. E. Bulman et al., "Low Resistance Ti/Pt/Au Ohmic Contacts to GaAs/Al$_x$Ga$_{1-x}$As Heterostructures ...", *J. Electrochem. Soc.*, vol. 136, No. 8, Aug. 1989, pp. 2423-2426.

"Pt/Ti/Pt/Au Ohmic Contact For p-type GaAs" by H. Okada, S. Shikata and H. Hayashi, Mar. 1990.

Uenoyama et al, 1988 Autumn Conference of Applied Physics, (1988).

V. Kumar, J. Phys. Chem Solids, vol. 36, p. 535.

Okada et al., "Electrical Characteristics & Reliability of Pt/Ti/Pt/Au Ohmic Contacts to p-type GaAs", *Japanese Journal of Applied Physics*, vol. 30, No. 4A, Apr., 1991, pp. L558-L560.

*Primary Examiner*—Brian E. Hearn
*Assistant Examiner*—Tuan Nguyen
*Attorney, Agent, or Firm*—Beveridge, DeGrandi, Weilacher & Young

[57] ABSTRACT

The present invention relates to an electrode forming process for forming an ohmic contact on a compound semiconductor crystal of a GaAs-based material having p-type conductivity. The process includes a first step of depositing a thin Pt layer having a thickness larger than 50 Å on the compound semiconductor crystal, and a second step of depositing a Ti/Pt/Au electrode on the Pt layer.

5 Claims, 4 Drawing Sheets

ELECTRODE FORMING PROCESS

This application is a continuation of application Ser. No. 08/026,075 filed Mar. 4, 1993 abandoned, which is a continuation of application Ser. No. 07/674,201, filed Mar. 25, 1991, abandoned, which applications are entirely incorporated herein by reference.

BACKGROUND OF THE INVENTION

1. Field of the Invention

This invention relates to an electrode forming process for forming an ohmic electrode on a compound semiconductor having a substrate of a p-type GaAs-based material.

2. Related Background Art

Conventionally as ohmic contacts on p-type GaAs and p-type $Al_xGa_{1-x}As$, Ti/Pt/Au and Cr/Au electrode structures have been studied as the non-alloy type, and AuZn, AuMn, AuBe, Pt/Zn/Au and Pd/Zn/Pd/Au electrode structures have been studied as the alloy type. Specifically, for example, Japanese Patent Laid-Open Publication No. SHO59-189669 describes forming an ohmic contact by alloying of Pt and GaAs. Extended Abstract 5p-G-16 (The 49th Spring Meeting, October 1988); The Japan Society of Applied Physics and Related Societies) describes forming an ohmic contact being Pt/Zn ohmic contact.

Requirements of these electrodes are 1) exhibition of low resistances, 2) flat and smooth surfaces, 3) no diffusion of electrode materials into substrates, 4) long-lasting reliability, and others.

Generally the non-alloy ohmic contact satisfies the above-described requirements 2 to 4 but, in comparison with the alloy ohmic contact, does not exhibit sufficiently low contact resistance. However the alloy ohmic contact exhibits sufficiently low contact resistance owing to increased surface impurity concentrations due to diffusion of active p-type dopants contained in the electrode materials. Resultantly a sufficiently low contact resistance whose specific resistance is below $10^{-6}$ $\Omega$ cm$^2$ can be obtained. However problems with the alloy ohmic contact are diffusion of impurities or electrode materials into the substrate, and low reliability and so on.

SUMMARY OF THE INVENTION

An object of this invention is to provide a process for forming an electrode which satisfies all the above-described four requirements.

A further object of this invention is to provide an electrode forming process for forming an ohmic contact on a compound semiconductor crystal of a GaAs-based material leaving p-type conductivity. This process comprises the first step of depositing a thin Pt layer having a thickness equal to or larger than 50 Å on a compound semiconductor crystal; and the second step of depositing a Ti/Pt/Au electrode on the Pt layer. This electrode forming process interposes a thin layer of Pt, whose work function is large, between the GaAs-based semiconductor and the Ti/Pt/Au electrode, whereby an ohmic electrode characterized by low contact resistance, flat smoothness, stability and high reliability can be obtained. In comparison with the art of interposing a Pt layer between a GaAs-based semiconductor and a ZnAu-based electrode, this process has an advantage that a semiconductor cap layer, e.g. InGaAs layer, enables the ohmic contact with an n-type GaAs-based semiconductor.

Another object of this invention is to provide an electrode forming process for forming an electrode having a Pt layer having a thickness larger than 50 Å and smaller than 200 Å (exclusive of 200 Å).

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Figure 1:
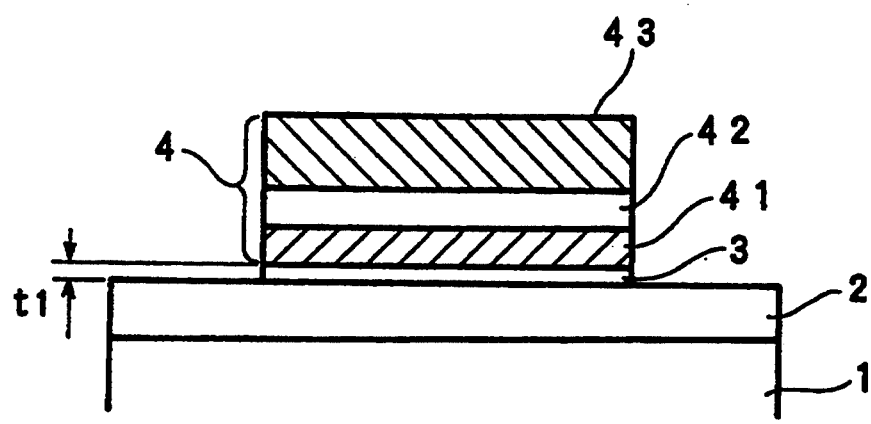
FIG. 1 is a sectional view of an electrode formed by the process according to this invention.

Embodiments of this invention will be explained with reference to the drawings attached hereto.

In the electrode structure according to this embodiment, a p$^+$-GaAs layer 2 is formed on a semi-conducting GaAs substrate 1, and on the p$^+$-GaAs layer 2 a Pt layer 3 is formed in contact therewith. On the Pt layer 3 there are formed a Ti electrode layer 41, a Pt electrode layer 42, and an Au electrode layer 43 in this stated order. The Pt layer 3, interposed between the GaAs layer 2 and the Ti/Pt/Au layer 4 consisting of the layers 41, 42 and 43, has a thickness $t_1$ equal to or larger than 50 Å and smaller than 400 Å. The semiconductor (p$^+$-GaAs) layer 2 can be formed by ion implantation, epitaxial growth or others and is effectively applicable to contact electrodes on p-type GaAs-based semiconductors composing p-channel FETs, diodes (including lasers), and bipolar transistors. It is also possible to use ohmic contacts for n-type GaAs-based semiconductors by providing an InGaAs cap layer below the electrode. The process per se for forming the InGaAs cap layer below the electrode is disclosed by Koichi Nagata et al. (IEEE TRANSACTIONS ON ELECTRON DEVICES, vol. ED-35, No. 1, p. 2, January, 1988). In contrast to this, the ZnAu electrode disclosed by Eiji Murata and Isao Kamo can be only used as ohmic contacts of p-type GaAs-based semiconductors (Japanese Patent Laid-Open Publication No. SHO 59-189669).

Figure 2:
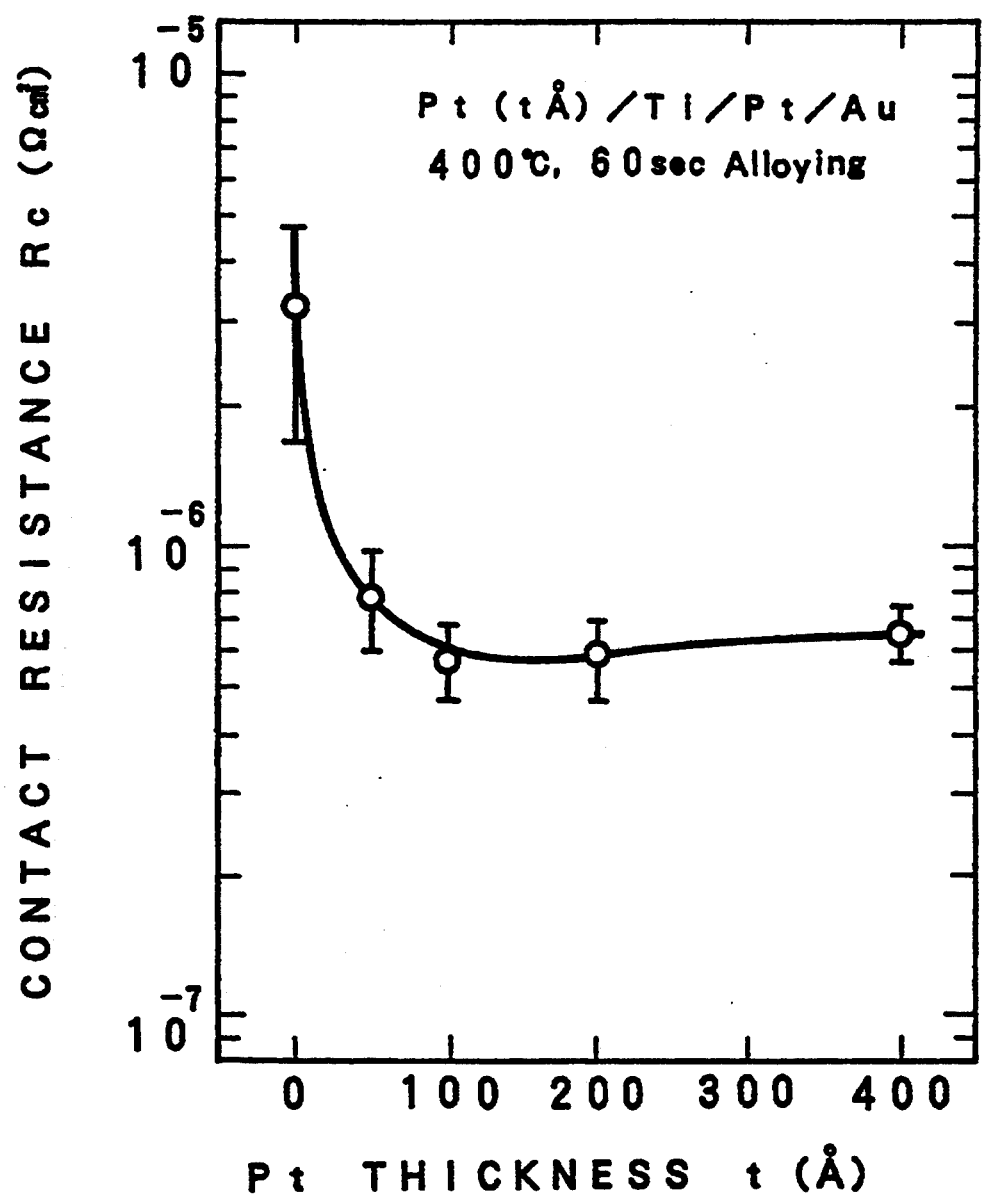
FIG. 2 is a graph showing changes in the contact resistance when the thickness of the Pt layer between the p$^+$-GaAs layer and the Ti/Pt/Au electrode is varied from 0 to 400 Å.

FIG. 2 shows changes of the contact resistance in the case where the film thickness of the Pt layer 3 between the p$^+$-GaAs layer 2 and the Ti/Pt/Au electrode 4 is varied from 0 to 400 Å. The contact resistance is lowered to below ⅓ by making the Pt layer 3 more than 50 Å thick, and when the thickness was above 50 Å, to 100 Å, the dispersion value became small. This proves that the insertion of the Pt layer 3 is sufficiently effective.

In terms of the contact resistance, a good result was obtained when the thickness of the Pt layer was 400 Å. However, it is preferable for the ohmic electrode in the field that this invention relates to that the depth of the reaction of the Pt in the GaAs semiconductor is smaller than 500 Å, more preferably smaller than 400 Å. In view of this it is preferable that the Pt layer 3 has a thickness larger than 50 Å, but smaller than 200 Å exclusive of 200 Å. According to the Naotaka Uchitomi et al. report (Extended Abstract 7a-D-10 (The 29th Spring Meeting 1982; The Japan Society of Applied Physics and Related Societies) or the V Kumar report (J. Phys. Chem. Solids, 1975, vol. 36, pp.535–541), the solid phase reaction of Pt into the GaAs-based semiconductor advances up to a depth of about twice a deposition thickness of the Pt and stops there. Accordingly, when the required reaction depth of the Pt is 500 Å, the thickness of the Pt layer 3 to be deposited is 250 Å, and when the reaction depth of the Pt is 400 Å, the thickness of the Pt layer 3 is 200 Å.

Figure 3:
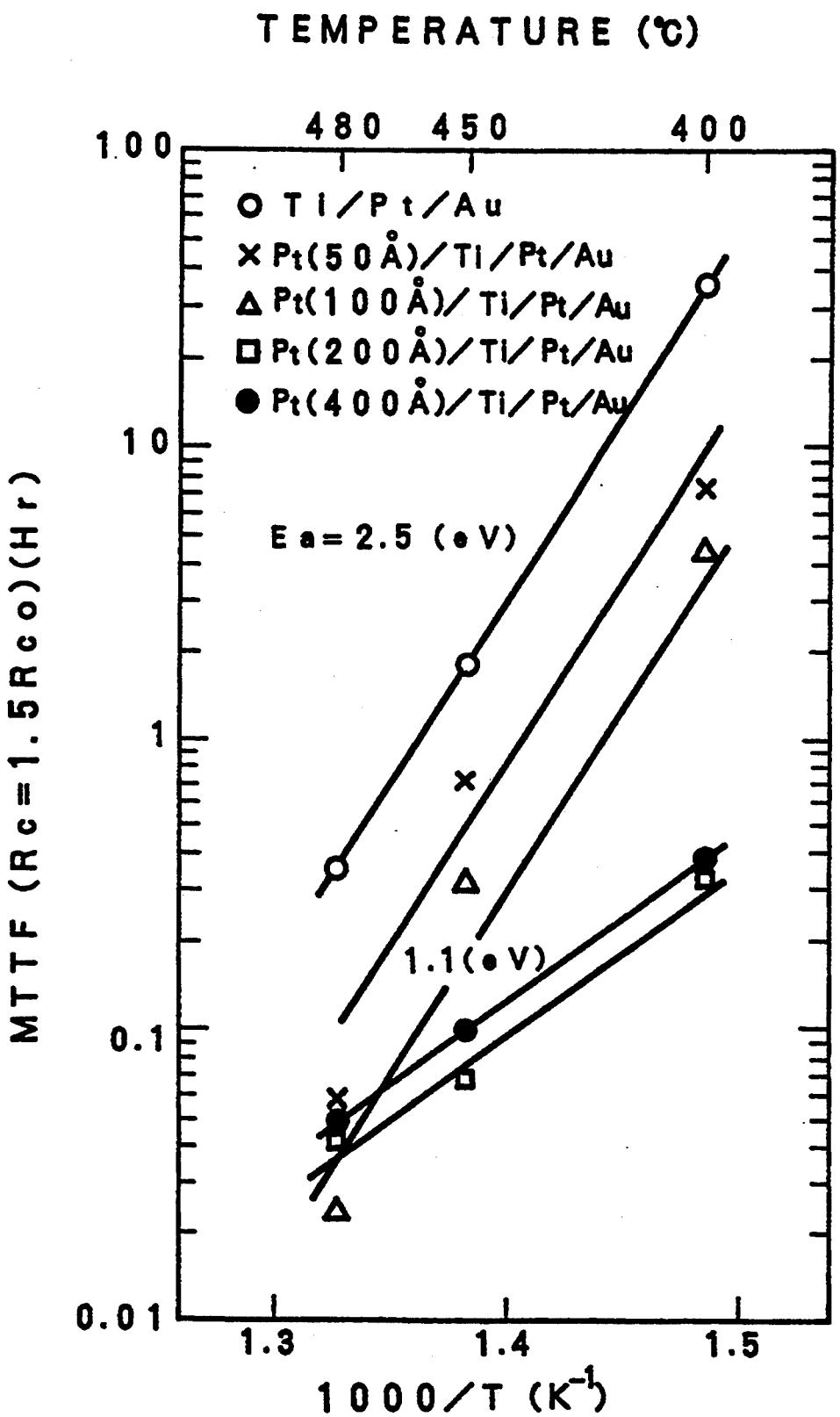
FIG. 3 is an Arrehenius plot for a life-time test with the average life set at a 1.5 time rise of a contact resistance value.

The inventors have made a study of this point in connection with FIG. 3. FIG. 3 is an Arrhenius plot of degradation of the contact resistance in the case where the thickness of the Pt layer 3 on the surface of the GaAs-based semiconductor is varied. The temperature used in a life-time test is on the horizontal axis, and the mean time to failure is taken on the vertical axis. The mean time to failure is a time in which the resistance goes up to 1.5 times an initial contact resistance value. As seen from FIG. 3, when the thickness of the Pt layer 3 is smaller than 200 Å, the activation energy is so high that a long life-time at low temperatures can be expected. The mean time to failure at 300° C. on the extrapolated line in FIG. 3 shows a sufficiently practical life-time of about 10 years. On the other hand, when the thickness of the Pt layer 3 is larger than 200 Å, it is seen that the mean time is shorter compared with that when the thickness is smaller than 200 Å exclusive of 200 Å. The mean time was calculated at 150° C. This result is shown in TABLE 1. It is seen that the mean time becomes very short when the thickness of the Pt layer 3 is larger than 200 Å. The average mean time required for ohmic electrodes of this type is generally higher than $1 \times 10^4$ hrs., preferably $1 \times 10^5$ hrs.

Figure 4:
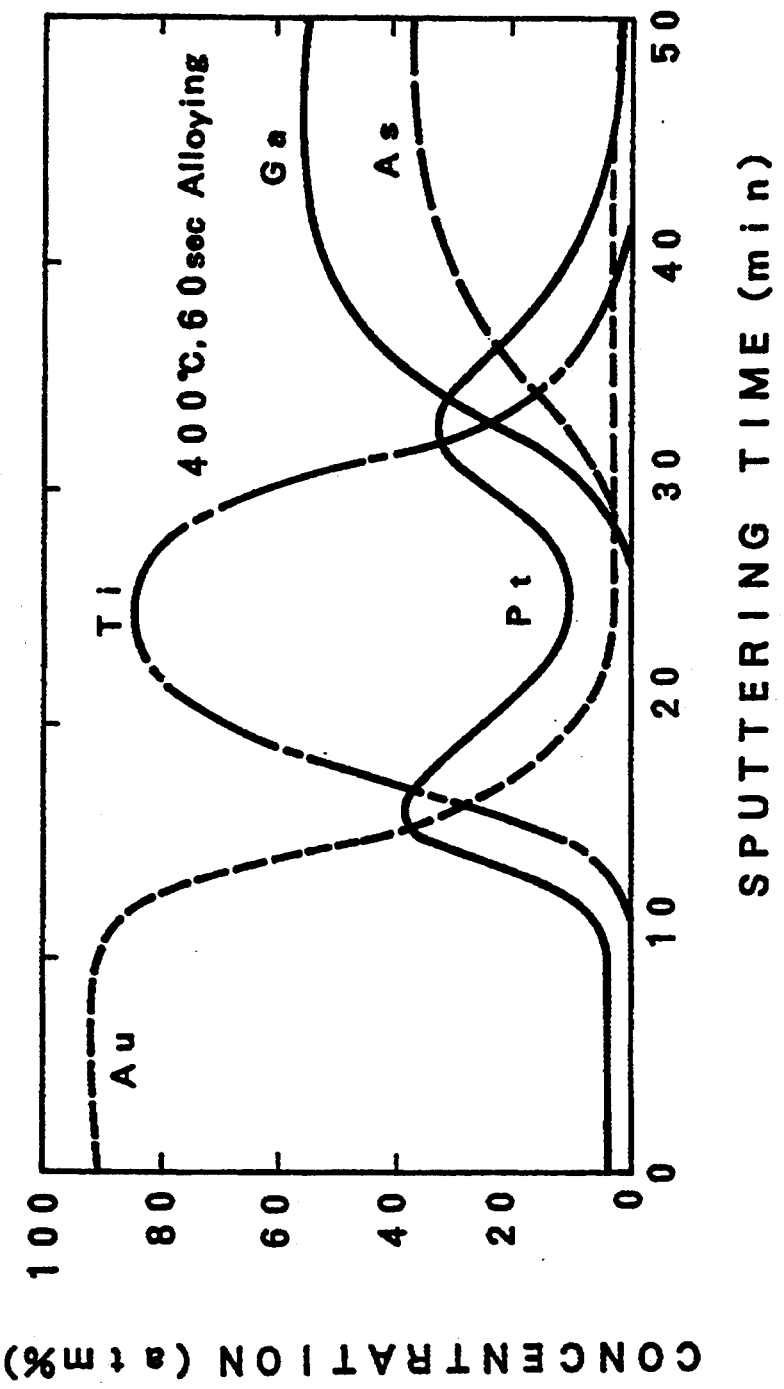
FIG. 4 shows a μ-AES profile of the electrode of FIG. 1.

Furthermore, in the case where the thickness of the Pt layer at the GaAs/Pt interface is 100 Å, its profile with depth after alloying was studied. The result is shown in FIG. 4. The measurement of this profile was conducted by a μ-AES analysis. It is seen that the profile is steep as before the alloying. This shows that low contact resistance is obtained by the GaAs/Pt contact, and no reaction layer will not be necessary between the GaAs and the Pt.

An embodiment of the ohmic contact with respect to the $p^+$-GaAs layer 2 has been explained. However actually by providing a Pt layer with respect to a $p^+$-$Al_xGa_{1-x}As$ layer, the contact resistance is lowered in accordance with the band theory, and it can be expected that more stable reaction product ($PtAs_2$) will be formed.

TABLE 1

Extrapolated MTTF for various interface platinum thickness at 150° C.

| Interface Platinum Thickness (Å) | μ50 (150° C.) (hour) |
|---|---|
| 0 | $3.0 \times 10^{12}$ |
| 50 | $1.2 \times 10^{12}$ |
| 100 | $5.2 \times 10^{11}$ |
| 200 | $3.0 \times 10^4$ |
| 400 | $4.2 \times 10^4$ |

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A method of forming an ohmic contact electrode comprising the steps of:
    forming a $p^+$-type conductivity type semiconductor layer on a substrate, said semiconductor layer being made of a compound semiconductor crystal of a GaAs based material;
    depositing a first layer made of Pt on the $p^+$-type conductivity type semiconductor layer, said first layer having a thickness larger than 50 Å; and
    forming a second layer of a Ti/Pt/Au electrode on the first layer to thereby form an ohmic contact electrode on the $p^+$-type conductivity type semiconductor layer.

2. A method according to claim 1, further comprising a step of heating the second layer after forming of the second layer thereby to form the ohmic contact state.

3. A method according to claim 1, wherein a thickness of the first layer is larger than 50 Å and smaller than 200 Å.

4. A method according to claim 1, wherein the compound semiconductor crystal is a semiconductor layer of a GaAs-based material crystal-grown on the substrate.

5. A method according to claim 1, wherein the compound semiconductor crystal is a substrate of a GaAs-based material.

* * * * *